(12) United States Patent
Manabe et al.

(10) Patent No.: US 10,218,924 B2
(45) Date of Patent: Feb. 26, 2019

(54) LOW NOISE CMOS IMAGE SENSOR BY STACK ARCHITECTURE

(71) Applicant: OMNIVISION TECHNOLOGIES, INC., Santa Clara, CA (US)

(72) Inventors: Sohei Manabe, San Jose, CA (US); Keiji Mabuchi, Los Altos, CA (US); Takayuki Goto, Foster City, CA (US); Duli Mao, Sunnyvale, CA (US); Hiroaki Ebihara, Santa Clara, CA (US); Kazufumi Watanabe, Mountain View, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 15/485,534

(22) Filed: Apr. 12, 2017

(65) Prior Publication Data

US 2018/0302579 A1  Oct. 18, 2018

(51) Int. Cl.
  *H04N 5/335*  (2011.01)
  *H01L 27/146*  (2006.01)
  *H04N 5/374*  (2011.01)
  *H04N 5/378*  (2011.01)
  *H04N 5/355*  (2011.01)
  *H04N 5/3745*  (2011.01)

(52) U.S. Cl.
  CPC ....... *H04N 5/3559* (2013.01); *H01L 27/1461* (2013.01); *H01L 27/14609* (2013.01); *H01L 27/14612* (2013.01); *H01L 27/14634* (2013.01); *H01L 27/14636* (2013.01); *H01L 27/14643* (2013.01); *H04N 5/378* (2013.01); *H04N 5/3745* (2013.01)

(58) Field of Classification Search
  CPC ............ H04N 5/3559; H01L 27/14634; H01L 27/14609
  See application file for complete search history.

(56) References Cited

U.S. PATENT DOCUMENTS

2013/0256510 A1* 10/2013 Lyu .................. H01L 27/14612
                                                              250/208.1
2016/0043126 A1   2/2016 Fan

* cited by examiner

*Primary Examiner* — Ahmed A Berhan
(74) *Attorney, Agent, or Firm* — Christensen O'Connor Johnson Kindness PLLC

(57) ABSTRACT

A pixel circuit for use in a high dynamic range (HDR) image sensor includes a photodiode and a floating diffusion is disposed in the first semiconductor wafer. A transfer transistor is disposed in the first semiconductor wafer and is adapted to be switched on to transfer the charge carriers photogenerated in the photodiode to the floating diffusion. An in-pixel capacitor is disposed in a second semiconductor wafer. The first semiconductor wafer is stacked with and coupled to the second semiconductor wafer. A dual floating diffusion (DFD) transistor is disposed in the first semiconductor wafer. The in-pixel capacitor is selectively coupled to the floating diffusion through the DFD transistor. The floating diffusion is set to low conversion gain in response to the in-pixel capacitor being coupled to the floating diffusion, and high conversion gain in response to the in-pixel capacitor being decoupled from the floating diffusion.

21 Claims, 3 Drawing Sheets ns, and more specifically, the present invention is directed
LOW NOISE CMOS IMAGE SENSOR BY STACK ARCHITECTURE

BACKGROUND INFORMATION

Field of the Disclosure

The present invention is generally related to image sensors, and more specifically, the present invention is directed to high dynamic range image sensors.

Background

Standard image sensors have a limited dynamic range of approximately 60 to 70 dB. However, the luminance dynamic range of the real world is much larger. Natural scenes often span a range of 90 dB and over. In order to capture the highlights and shadows simultaneously, HDR technologies have been used in image sensors to increase the captured dynamic range. The most common techniques to increase dynamic range is to merge multiple exposures captured with standard (low dynamic range) image sensors into a single linear HDR image, which has much larger dynamic range than a single exposure image.

One of the most common HDR sensor solutions would be having multiple exposures into one single image sensor. With different exposure integration times or different sensitivities (for example by inserting neutral density filters), one image sensor could have 2, 3, 4 or even more different exposures in a single image sensor. Multiple exposure images are available in a single shot using this HDR image sensor. However, overall image resolution is decreased using this HDR sensor compared to a normal full resolution image sensor. For example, for an HDR sensor that combines 4 different exposures in one image sensor, each HDR image would be only a quarter resolution of the full resolution image.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
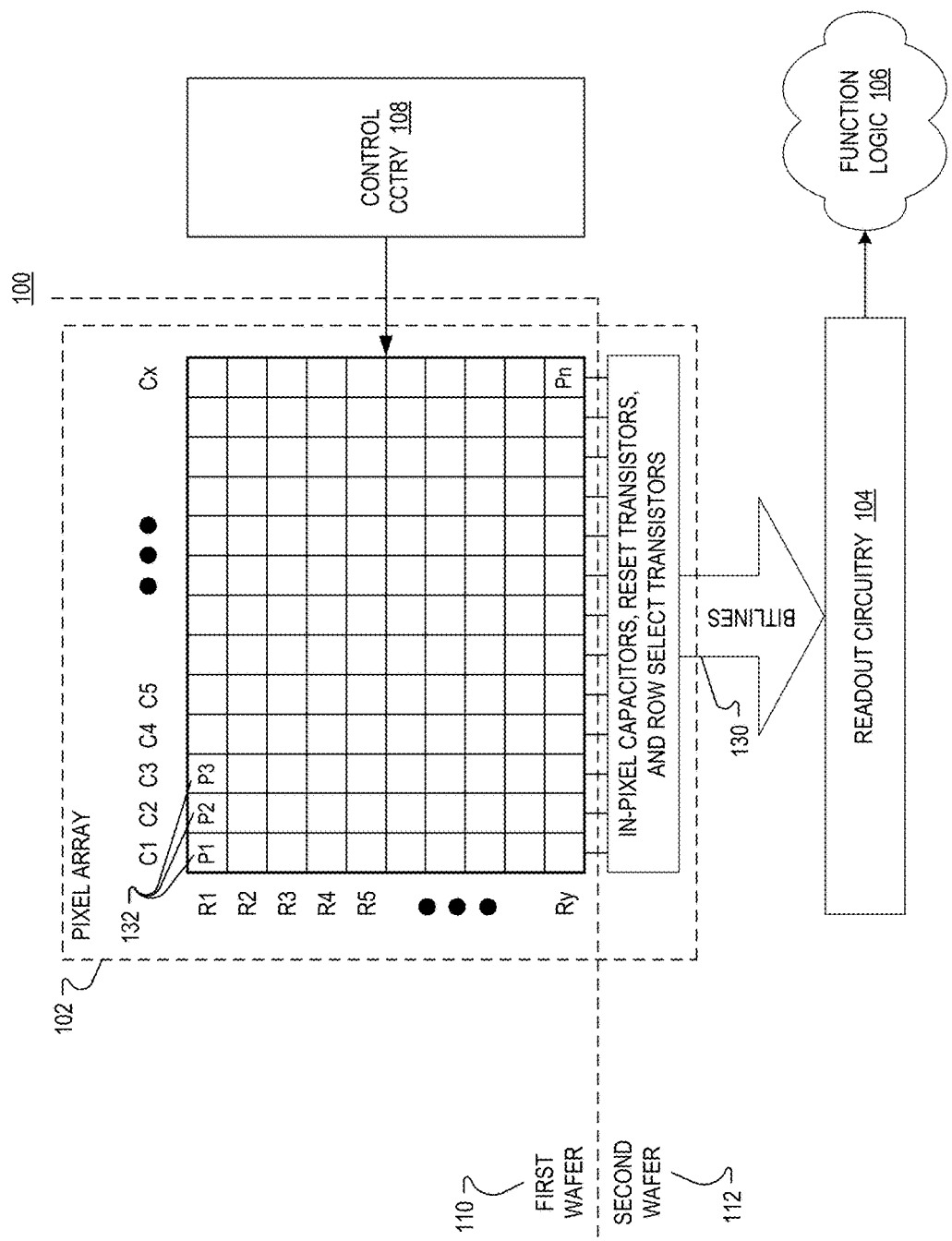
FIG. 1 is a diagram illustrating one example of imaging system including a color pixel array in which each pixel circuit is a dual conversion gain circuit including a stacked architecture to achieve high dynamic range (HDR) imaging in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe color pixel array in which each pixel circuit is read out with dual conversion gain to achieve HDR imaging in accordance with the teachings of the present invention. In the examples, each pixel circuit is implemented in a stacked architecture including at least two semiconductor wafers, with the photodiode, floating diffusion (FD), transfer transistor and a dual floating diffusion (DFD) transistor disposed in a first semiconductor wafer, and an in-pixel capacitor disposed in a second semiconductor wafer that is stacked with and coupled to the first semiconductor wafer to achieve HDR imaging in accordance with the teachings of the present invention. Thus, one of the wafers includes the pixel array, and another one of the wafers is a logic wafer.

In one example, the conversion gain in the pixel circuits of the pixel array is set to high or low by enabling or disabling the DFD transistor that couples the in-pixel capacitor to the FD node. With this structure, high conversion gain can be very high, and low conversion gain can be very low. As will be disclosed, this structure provides high conversion gain with a small full well capacity when a dual floating diffusion transistor is turned off, and low conversion gain with a large full well capacity when the dual floating diffusion transistor is turned on, even for small sized pixels in accordance with the teachings of the present invention.

Thus, every frame may be read out with both high conversion gain and low conversion and the selection of which conversion gain to use is done digitally by turning on or off the dual floating diffusion transistor. This way, the color pixel array in accordance with the teachings of the present invention can capture both bright objects and dark objects simultaneously in the same frame with a single exposure or a single integration time in accordance with the teachings of the present invention. Therefore, multiple exposures of high exposure times and low exposure times are no longer necessary, which can introduce challenges because the multiple exposures times do not occur simultaneously. As a result, the problems of ghosting and light flickering are eliminated since a color pixel array in accordance with the teachings of the present invention outputs pixel values with different conversion gains to produce HDR images with only one integration time per frame output.

To illustrate, FIG. 1 is a diagram illustrating one example of a high dynamic range (HDR) imaging system 100 including a color pixel array 102 in which each pixel circuit is read out with dual conversion gain to achieve HDR imaging in accordance with the teachings of the present invention. As shown in the depicted example, HDR imaging system 100 includes pixel array 102 coupled to control circuitry 108 and readout circuitry 104, which is coupled to function logic 106.

In one example, pixel array 102 is a two-dimensional (2D) array of image sensor pixel circuits 132 (e.g., P1, P2, P3, . . . , Pn). As illustrated, each pixel circuit 132 is arranged into a row (e.g., rows R1 to Ry) and a column (e.g., column C1 to Cx) to acquire image data of a person, place, object, etc., which can then be used to render a 2D image of the person, place, object, etc.

In one example, after each pixel circuit 132 (e.g., P1, P2, P3, . . . , Pn) has acquired its image data or image charge, the image data is readout by readout circuitry 104 through bitlines 130 and then transferred to function logic 106. In various examples, readout circuitry 104 may include amplification circuitry, analog-to-digital (ADC) conversion circuitry, or otherwise. Function logic 106 may simply store the image data or even manipulate the image data by applying post image effects (e.g., crop, rotate, remove red eye, adjust brightness, adjust contrast, or otherwise). In one example, readout circuitry 104 may readout a row of image data at a time along readout column lines (illustrated) or may readout the image data using a variety of other techniques (not illustrated), such as a serial readout or a full parallel readout of all pixels simultaneously.

In one example, control circuitry 108 is coupled to pixel array 102 to control operational characteristics of pixel circuits 132 of pixel array 102. In one example, control circuitry 108 may be coupled to generate a global shutter signal for controlling image acquisition for each pixel circuit 132. In the example, the global shutter signal simultaneously enables all pixel circuits 132 (e.g., P1, P2, P3, . . . , Pn) within pixel array 102 to simultaneously enable all of the pixel circuits 132 in pixel array 102 to simultaneously transfer the image charge from each respective photodetector during a single acquisition window.

As shown in the depicted example, and as will be described in further detail below, the photodiodes, as well as the floating diffusions (FD), transfer transistors and a dual floating diffusion (DFD) transistors pixel array 102 are disposed in a first semiconductor wafer 110, and the in-pixel capacitors, reset transistors, and row select transistors of pixel array 102 are disposed in a second semiconductor wafer 112 that is stacked with and coupled to the first semiconductor wafer 110 in a stacked chip architecture to achieve HDR imaging in accordance with the teachings of the present invention. In other words, in one example, the first semiconductor wafer 110 includes pixel array 102, and the second semiconductor wafer 112 is a logic wafer in accordance with the teachings of the present invention.

Figure 2:
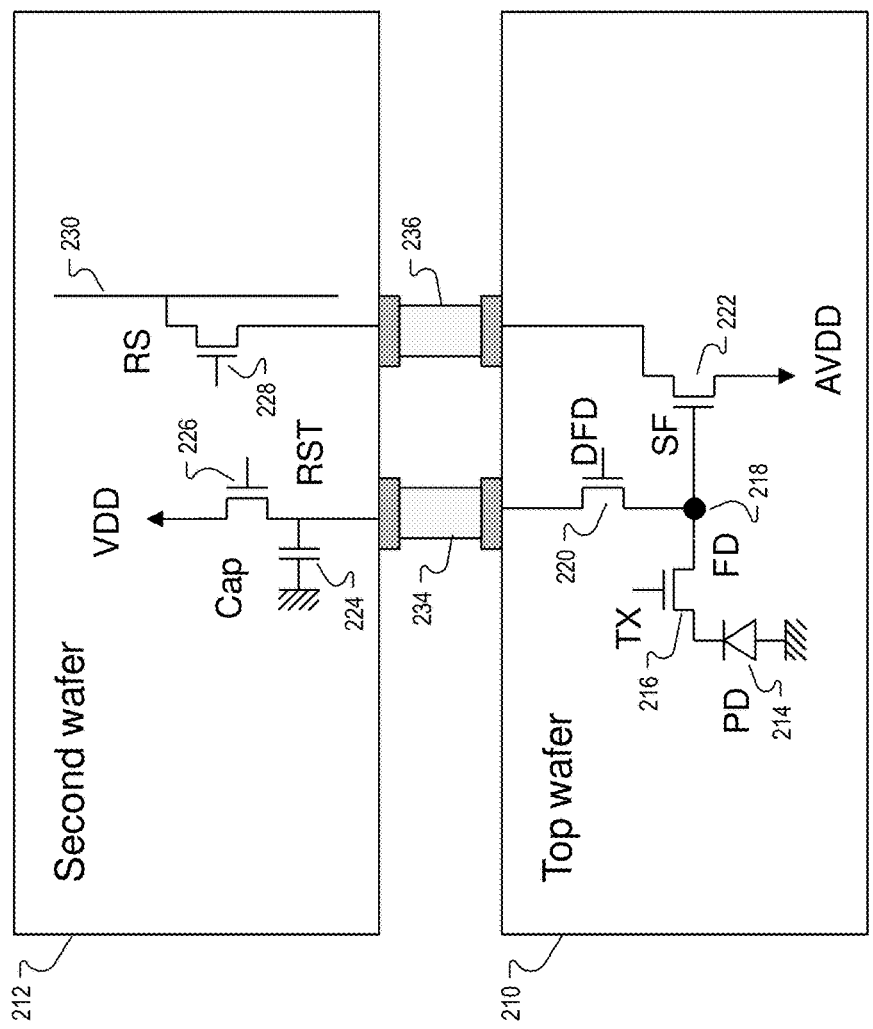
FIG. 2 is a diagram illustrating one example of a pixel circuit with dual conversation gain implemented in a stacked architecture to achieve HDR imaging in accordance with the teachings of the present invention.

FIG. 2 is a diagram illustrating one example of a pixel circuit 232 with dual conversation gain implemented in a stacked architecture to achieve HDR imaging in accordance with the teachings of the present invention. It is noted that pixel circuit 232 may be an example of one of the pixel circuits 132 of pixel array 102 of FIG. 1, and that similarly named and numbered elements referenced below are coupled and function similar to as described above. As shown in the example depicted in FIG. 2, pixel circuit 232 includes a photodiode PD 214 disposed in a first semiconductor wafer 210 (also labeled "top wafer" in FIG. 2). In the example, the photodiode PD 214 is adapted to photogenerate charge carriers in response to incident light during a single exposure of a single image capture of the HDR image sensor. A floating diffusion (FD) disposed in the first semiconductor wafer 210, and is coupled to receive the charge carriers photogenerated in the photodiode PD 214. A transfer transistor 216 is disposed in the first semiconductor wafer 210, and coupled is between the photodiode PD 214 and the floating diffusion 218. The transfer transistor 216 is adapted to be switched on and off in response to a transfer signal TX to selectively transfer the charge carriers photogenerated in the photodiode PD 214 to the floating diffusion 218.

A dual floating diffusion (DFD) transistor 220 disposed in the first semiconductor wafer 210, and is coupled to the floating diffusion 218 and an in-pixel capacitor. The in-pixel capacitor 224 disposed in a second semiconductor wafer 212. In the depicted example, the in-pixel capacitor 224 is terminated to ground. In various examples, it is noted that the in-pixel capacitor 224 may be implemented with a metal oxide semiconductor (MOS) capacitor, a metal insulator metal (MIM) capacitor, a trench capacitor, or any other suitable type of capacitor.

In the example, the first semiconductor wafer 210 is stacked with and coupled to the second semiconductor wafer 212 in a stacked chip architecture. As such, the in-pixel capacitor 224 is selectively coupled to the floating diffusion 218 through the DFD transistor 220 in response to a dual floating diffusion signal DFD. The floating diffusion 218 is therefore set to low conversion gain in response to the in-pixel capacitor 224 being coupled to the floating diffusion through DFD transistor 220. In addition, the floating diffusion 218 is set to high conversion gain in response to the in-pixel capacitor 224 being decoupled from the floating diffusion 218 by the DFD transistor 220 being switched off in response to the DFD signal.

As shown in the depicted example, pixel circuit 232 also includes an amplifier transistor 222 disposed in the first semiconductor wafer 210. In one example, the amplifier transistor 222 is a source follower (SF) coupled field effect transistor (FET), and therefore includes a gate terminal coupled to the floating diffusion 218 to generate an output signal of the pixel circuit 232 at the source terminal of the amplifier transistor 222. In the example, the drain of the amplifier transistor 222 is coupled to an AVDD voltage.

Continuing with the example depicted in FIG. 2, a row select transistor 228 disposed in the second semiconductor wafer 212, and is coupled to the amplifier transistor 222 in the first semiconductor wafer 210 to selectively couple, in response to a row select signal RS, the output signal of the pixel circuit 232 from amplifier transistor 222 through a via 236 to an output bitline 230 in the second semiconductor wafer 212. In the example, via 236 is therefore coupled between the first semiconductor wafer 210 and second semiconductor wafer 212, and is coupled between the row select transistor 228 and the amplifier transistor 222. In one example, the output bitline 230 may be coupled to readout circuitry included in the second semiconductor wafer, such as for example readout circuitry 104 as illustrated in FIG. 1.

The example depicted in FIG. 2 also illustrates that a reset transistor is disposed in the second semiconductor wafer 212, and is coupled to the in-pixel capacitor 224 in the second semiconductor wafer and the DFD transistor 220 in the first semiconductor wafer through via 234. Thus, via 234 is coupled between the first semiconductor wafer 210 and second semiconductor wafer 212, and is coupled between the reset transistor 226 and the DFD transistor 220. In operation, the reset transistor 226 is coupled to selectively reset the floating diffusion 218 and the photodiode PD 214 in response to a reset signal RST. In the example, the DFD transistor 220 is selectively switched on in response to the DFD signal with the reset transistor 226 to reset the floating diffusion 218 and the photodiode PD 214.

In one example, it is appreciated that the in-pixel capacitor 224, the row select transistor 228, and the reset transistor 226 in the second semiconductor wafer 212 is arranged on second semiconductor wafer 212 at the same pitch as the corresponding pixel circuitry disposed in the first semiconductor wafer 210.

Figure 3:
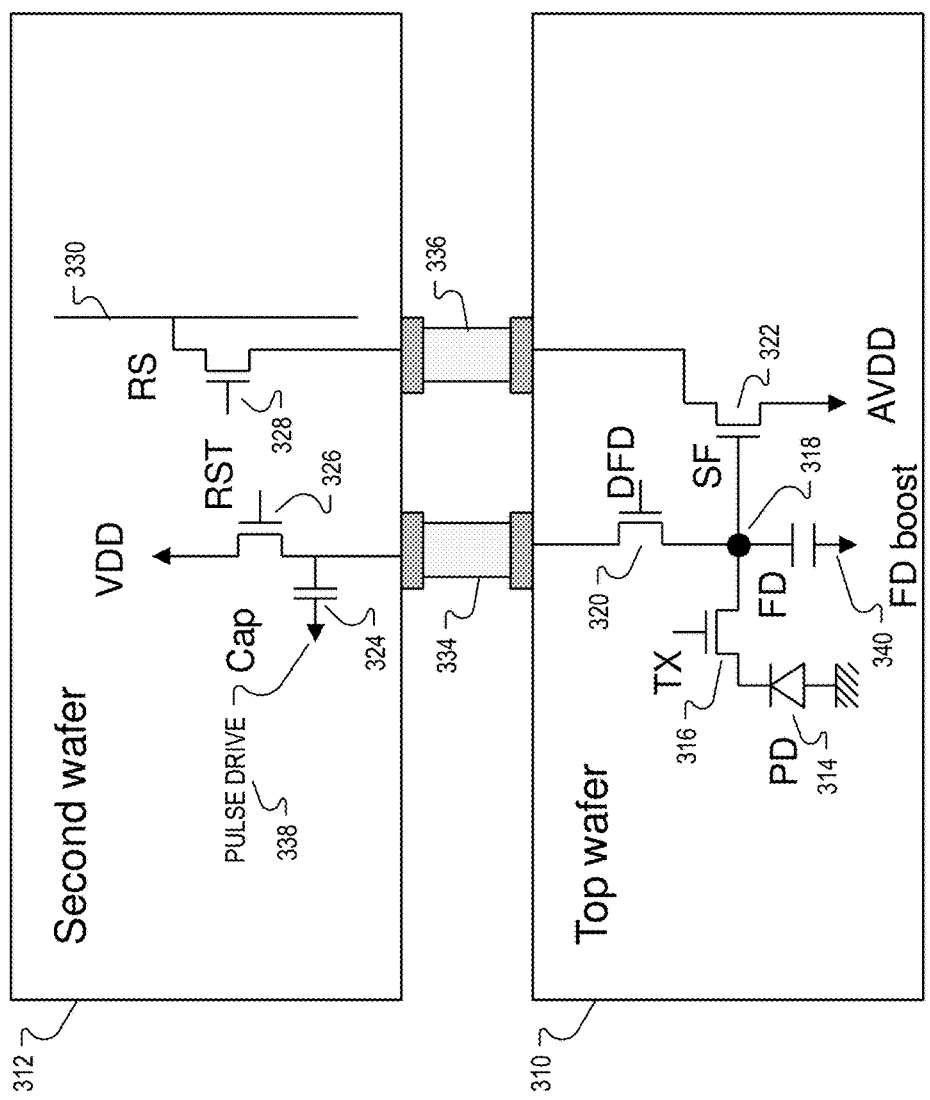
FIG. 3 is a diagram illustrating another example of a pixel circuit with dual conversion gain implemented in a stacked architecture to achieve HDR imaging in accordance with the teachings of the present invention.

FIG. 3 is a diagram illustrating another example of a pixel circuit 332 with dual conversation gain implemented in a stacked architecture to achieve HDR imaging in accordance with the teachings of the present invention. It is noted that pixel circuit 332 may be an example of one of the pixel circuits 132 of pixel array 102 of FIG. 1, and that similarly named and numbered elements referenced below are coupled and function similar to as described above. In addition, it is noted that pixel circuit 332 of FIG. 3 also shares many similarities with pixel circuit 232 of FIG. 2. Indeed, as shown in the example depicted in FIG. 3, pixel circuit 332 includes a photodiode PD 314 disposed in a first semiconductor wafer 310 (also labeled "top wafer"). A floating diffusion (FD) disposed in the first semiconductor wafer 310, and is coupled to receive the charge carriers photogenerated in the photodiode PD 314. In the example, the floating diffusion 318 is also capacitively coupled to a boost signal 340. A transfer transistor 316 is disposed in the first semiconductor wafer 310, and coupled is between the photodiode PD 314 and the floating diffusion 318. The transfer transistor 3216 is adapted to be switched on and off in response to a transfer signal TX to selectively transfer the charge carriers photogenerated in the photodiode PD 314 to the floating diffusion 318.

A dual floating diffusion (DFD) transistor 320 disposed in the first semiconductor wafer 310, and is coupled to the floating diffusion 318 and an in-pixel capacitor. The in-pixel capacitor 324 disposed in a second semiconductor wafer 312. In the depicted example, the in-pixel capacitor 324 is also coupled to a pulse drive signal 338 to increase actual handling capability. In various examples, it is noted that the in-pixel capacitor 324 may be implemented with a metal oxide semiconductor (MOS) capacitor, a metal insulator metal (MIM) capacitor, a trench capacitor, or any other suitable type of capacitor.

In the example, the first semiconductor wafer 310 is stacked with and coupled to the second semiconductor wafer 312 in a stacked chip architecture. As such, the in-pixel capacitor 324 is selectively coupled to the floating diffusion 318 through the DFD transistor 320 in response to a dual floating diffusion signal DFD. The floating diffusion 318 is therefore set to low conversion gain in response to the in-pixel capacitor 324 being coupled to the floating diffusion through DFD transistor 320. In addition, the floating diffusion 318 is set to high conversion gain in response to the in-pixel capacitor 324 being decoupled from the floating diffusion 318 by the DFD transistor 320 being switched off in response to the DFD signal.

As shown in the depicted example, pixel circuit 332 also includes an amplifier transistor 322 disposed in the first semiconductor wafer 310. In one example, the amplifier transistor 322 is a source follower (SF) coupled field effect transistor (FET), and therefore includes a gate terminal coupled to the floating diffusion 318 to generate an output signal of the pixel circuit 332 at the source terminal of the amplifier transistor 222. In the example, the drain of the amplifier transistor 322 is coupled to an AVDD voltage.

Continuing with the example depicted in FIG. 3, a row select transistor 328 disposed in the second semiconductor wafer 312, and is coupled to the amplifier transistor 322 in the first semiconductor wafer 310 to selectively couple, in response to a row select signal RS, the output signal of the pixel circuit 332 from amplifier transistor 322 through a via 336 to an output bitline 330 in the second semiconductor wafer 312. In the example, via 336 is therefore coupled between the first semiconductor wafer 310 and second semiconductor wafer 312, and is coupled between the row select transistor 328 and the amplifier transistor 322. In one example, the output bitline 330 may be coupled to readout circuitry included in the second semiconductor wafer, such as for example readout circuitry 104 as illustrated in FIG. 1.

The example depicted in FIG. 3 also illustrates that a reset transistor is disposed in the second semiconductor wafer 312, and is coupled to the in-pixel capacitor 324 in the second semiconductor wafer and the DFD transistor 320 in the first semiconductor wafer through via 334. Thus, via 334 is coupled between the first semiconductor wafer 310 and second semiconductor wafer 312, and is coupled between the reset transistor 326 and the DFD transistor 320. In operation, the reset transistor 326 is coupled to selectively reset the floating diffusion 318 and the photodiode PD 314 in response to a reset signal RST. In the example, the DFD transistor 320 is selectively switched on in response to the DFD signal with the reset transistor 326 to reset the floating diffusion 318 and the photodiode PD 314.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel circuit for use in a high dynamic range (HDR) image sensor, comprising:
   a photodiode disposed in a first semiconductor wafer, the photodiode adapted to photogenerate charge carriers in response to incident light during a single exposure of a single image capture of the HDR image sensor;
   a floating diffusion disposed in the first semiconductor wafer and coupled to receive the charge carriers photogenerated in the photodiode;

a transfer transistor disposed in the first semiconductor wafer and coupled between the photodiode and the floating diffusion, wherein the transfer transistor is adapted to be switched on to transfer the charge carriers photogenerated in the photodiode to the floating diffusion;

an in-pixel capacitor disposed in a second semiconductor wafer, wherein the first semiconductor wafer is stacked with and coupled to the second semiconductor wafer; and a dual floating diffusion (DFD) transistor disposed in the first semiconductor wafer and coupled between the floating diffusion and the in-pixel capacitor, wherein the DFD transistor is coupled to be enabled or disabled in response to a DFD signal such that the in-pixel capacitor is selectively coupled to the floating diffusion through the DFD transistor in response to the DFD signal, wherein the floating diffusion is set to low conversion gain in response to the in-pixel capacitor being coupled to the floating diffusion, and wherein the floating diffusion is set to high conversion gain in response to the in-pixel capacitor being decoupled from the floating diffusion.

2. The pixel circuit of claim 1, further comprising an amplifier transistor disposed in the first semiconductor wafer, wherein the amplifier transistor has a gate terminal coupled to the floating diffusion to generate an output signal of the pixel circuit.

3. The pixel circuit of claim 2, further comprising a row select transistor disposed in the second semiconductor wafer and coupled to the amplifier transistor to selectively couple the output signal of the pixel circuit to an output bitline in the second semiconductor wafer.

4. The pixel circuit of claim 3, further comprising a first via coupled between the first and second semiconductor wafers, and coupled between the row select transistor and the amplifier transistor.

5. The pixel circuit of claim 1 further comprising a reset transistor disposed in the second semiconductor wafer and coupled to the in-pixel capacitor in the second semiconductor wafer and the DFD transistor in the first semiconductor wafer, wherein the reset transistor is coupled to selectively reset the floating diffusion and the photodiode in response to a reset signal.

6. The pixel circuit of claim 5 wherein the DFD transistor is selectively switched on with the reset transistor to reset the floating diffusion and the photodiode.

7. The pixel circuit of claim 5, further comprising a second via coupled between the first and second semiconductor wafers, and coupled between the reset transistor and the DFD transistor.

8. The pixel circuit of claim 1, wherein the in-pixel capacitor is terminated to ground.

9. The pixel circuit of claim 1, wherein the in-pixel capacitor is coupled to a pulse drive signal.

10. The pixel circuit of claim 1, wherein the floating diffusion is capacitively coupled to a boost signal.

11. A high dynamic range (HDR) imaging sensor system, comprising:
a pixel array of pixel circuits, wherein each one of the pixel circuits includes:
a photodiode disposed in a first semiconductor wafer, the photodiode adapted to photogenerate charge carriers in response to incident light during a single exposure of a single image capture of the HDR imaging sensor system;

a floating diffusion disposed in the first semiconductor wafer and coupled to receive the charge carriers photogenerated in the photodiode;

a transfer transistor disposed in the first semiconductor wafer and coupled between the photodiode and the floating diffusion, wherein the transfer transistor is adapted to be switched on to transfer the charge carriers photogenerated in the photodiode to the floating diffusion;

an in-pixel capacitor disposed in a second semiconductor wafer, wherein the first semiconductor wafer is stacked with and coupled to the second semiconductor wafer; and a dual floating diffusion (DFD) transistor disposed in the first semiconductor wafer and coupled between the floating diffusion and the in-pixel capacitor, wherein the DFD transistor is coupled to be enabled or disabled in response to a DFD signal such that the in-pixel capacitor is selectively coupled to the floating diffusion through the DFD transistor in response to the DFD signal, wherein the floating diffusion is set to low conversion gain in response to the in-pixel capacitor being coupled to the floating diffusion, and wherein the floating diffusion is set to high conversion gain in response to the in-pixel capacitor being decoupled from the floating diffusion;

control circuitry coupled to the pixel array to control operation of the pixel array; and readout circuitry coupled to the pixel array to readout image data from the plurality of pixels.

12. The HDR imaging sensor system of claim 11, further comprising function logic coupled to the readout circuitry to store the image data from each one of the pixel circuits.

13. The HDR imaging sensor system of claim 11, wherein each one of the pixel circuits further comprises an amplifier transistor disposed in the first semiconductor wafer, wherein the amplifier transistor has a gate terminal coupled to the floating diffusion to generate an output signal of the pixel circuit.

14. The HDR imaging sensor system of claim 13, wherein each one of the pixel circuits further comprises a row select transistor disposed in the second semiconductor wafer and coupled to the amplifier transistor to selectively couple the output signal of the pixel circuit to an output bitline in the second semiconductor wafer.

15. The HDR imaging sensor system of claim 14, wherein each one of the pixel circuits further comprises a first via coupled between the first and second semiconductor wafers, and coupled between the row select transistor and the amplifier transistor.

16. The HDR imaging sensor system of claim 11, wherein each one of the pixel circuits further comprises a reset transistor disposed in the second semiconductor wafer and coupled to the in-pixel capacitor in the second semiconductor wafer and the DFD transistor in the first semiconductor wafer, wherein the reset transistor is coupled to selectively reset the floating diffusion and the photodiode in response to a reset signal.

17. The HDR imaging sensor system of claim 16, wherein the DFD transistor is selectively switched on with the reset transistor to reset the floating diffusion and the photodiode.

18. The HDR imaging sensor system of claim 16, wherein each one of the pixel circuits further comprises a second via coupled between the first and second semiconductor wafers, and coupled between the reset transistor and the DFD transistor.

19. The HDR imaging sensor system of claim 11, wherein the in-pixel capacitor is terminated to ground.

20. The HDR imaging sensor system of claim 11, wherein the in-pixel capacitor is coupled to a pulse drive signal.

21. The HDR imaging sensor system of claim 11, wherein the floating diffusion is capacitively coupled to a boost signal.

* * * * *